(12) United States Patent
Zou et al.

(10) Patent No.: US 8,399,264 B2
(45) Date of Patent: Mar. 19, 2013

(54) ALIGNMENT INSPECTION

(75) Inventors: Zhihua Zou, Chandler, AZ (US); Liang Zhang, Chandler, AZ (US); Sheng Li, Gilbert, AZ (US); Tamil Selvamuniandy, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/957,169

(22) Filed: Nov. 30, 2010

(65) Prior Publication Data

US 2012/0135546 A1 May 31, 2012

(51) Int. Cl.
*H01L 21/00* (2006.01)
*H01L 21/66* (2006.01)
*H01L 21/44* (2006.01)
*H01L 23/58* (2006.01)
*G01R 31/26* (2006.01)

(52) U.S. Cl. ............. 438/7; 438/16; 438/612; 257/642; 257/E21.53; 257/E21.577

(58) Field of Classification Search ................... None
See application file for complete search history.

(56) References Cited

U.S. PATENT DOCUMENTS

| 5,040,047 | A | * | 8/1991 | Cole et al. .................. 257/642 |
| 6,014,209 | A | * | 1/2000 | Bishop ..................... 356/237.5 |
| 2009/0152461 | A1 | * | 6/2009 | Kim .......................... 250/307 |

* cited by examiner

*Primary Examiner* — Fernando L Toledo
*Assistant Examiner* — Valerie N Newton
(74) *Attorney, Agent, or Firm* — Winkle, PLLC

(57) ABSTRACT

The present disclosure relates to the field of microelectronic substrate fabrication and, more particularly, to alignment inspection for vias formed in the microelectronic substrates. The alignment inspection may be achieved by determining the relative positions of fluorescing and non-fluorescing elements in a microelectronic substrate.

14 Claims, 4 Drawing Sheets

ALIGNMENT INSPECTION

BACKGROUND

Embodiments of the present description generally relate to the field of microelectronic substrate fabrication and, more particularly, to alignment inspection for vias formed in the microelectronic substrates.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
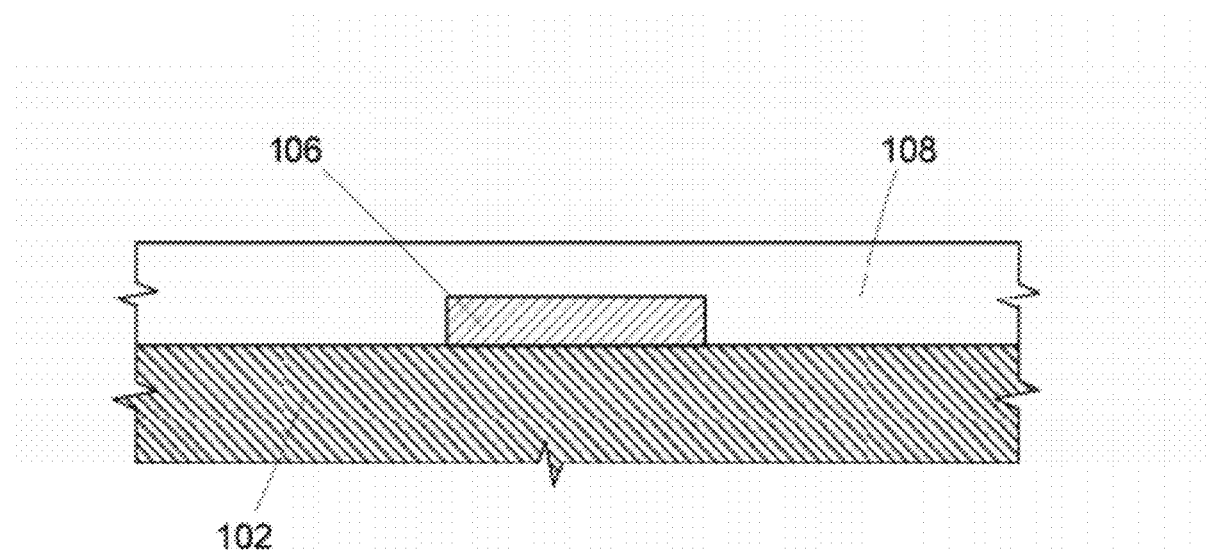
FIG. 1 illustrates a side cross-sectional view of a support substrate with a contact land formed thereon and a dielectric layer deposed over the contact land and the support substrate.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description generally relate to the field of microelectronic substrate fabrication and, more particularly, to alignment inspection for vias formed in the microelectronic substrates. The alignment inspection may be achieved by determining the relative positions of fluorescing and non-fluorescing element in a microelectronic substrate.

As the size of microelectronic devices continues to decrease, the space or pitch between external attachment structures, such as solder bumps, for the microelectronic devices becomes smaller. Thus, the tolerances for the processes, such as lithography, used in forming the external attachment structures and their related structures within the microelectronic device, as well as external mounting elements, such as motherboards, become smaller and smaller. These smaller tolerances increase the potential of misalignment, which may result in reliability issues and yield loss for the microelectronic devices.

FIG. 1 illustrates a side cross-sectional view of a support substrate 102 having a contact land 106 may be formed thereon. The contact land 106 may be any appropriate conductive material, including, but not limited to, copper, aluminum, silver, gold, and alloys thereof. The contact land 106 may be electrically connected to the conductive traces (not shown) of the support substrate 102 through conductive vias and/or conductive traces (not shown). The support substrate 102 may include, but is not limited to, a portion of a printed circuit board or other similar circuit board used for mounting and forming communication between microelectronic devices, a portion of an interposer used in conjunction with the fabrication a microelectronic device package, or a portion of the microelectronic device itself, as will be understood to those skilled in the art.

When the support substrate 102 is an interposer, a printed circuit board, or the like, it may include a core (not shown) (e.g. bismaleimide triazine resin, FR4, polyimide materials, and the like) and a plurality of dielectric layers (not shown) (e.g. epoxy resin, polyimide, bisbenzocyclobutene, and the like) with conductive traces (not shown) (e.g. copper, aluminum, silver, gold, and the like) formed on each dielectric layer with conductive vias (not shown) (e.g. copper, aluminum, silver, gold, and the like) extending through each dielectric layer to connect the conductive traces, conductive lands, and/or electrical components, on different layers. The processes and materials used in the fabrication of the support substrate 102 will be understood to those skilled in the art.

As further shown in FIG. 1, a dielectric layer 108 may be deposed over the contact land 106 and the support substrate 102. The processes that may be used in the deposition of the dielectric layer 108 will be understood to those skilled in the art. The materials used in forming dielectric layers 108 are generally substantially opaque, such that the contact land 106 cannot be seen clearly under the dielectric layer 108 with normal lighting conditions.

In one embodiment, the dielectric layer 108 may be one of the plurality of dielectric layers used in fabricating the supporting substrate, as previously discussed. In this embodiment, the first dielectric layer may comprise silica-filled epoxy, such as build-up films available from Ajinomoto Fine-Techno Co., Inc., 1-2 Suzuki-cho, Kawasaki-ku, Kawasaki-shi, 210-0801, Japan (e.g. Ajinomoto ABF-GX13, Ajinomoto GX92, and the like).

In another embodiment, the dielectric layer 108 may be a solder resist material, such as polymer material. The polymer material may include, but is not limited to, SR7200 or SR7300 available from Hitachi Chemical Co., Ltd., Shinjuku-Mitsui Building, 1-1 Nishi-Shinjuku 2-chome, Tokyo, Japan. The solder resist material is used to ensure that a subsequently formed solder bump (not shown) remains in a desired area. The solder bump (not shown) may be used to connect the assembly to external devices (not shown).

Figure 2:
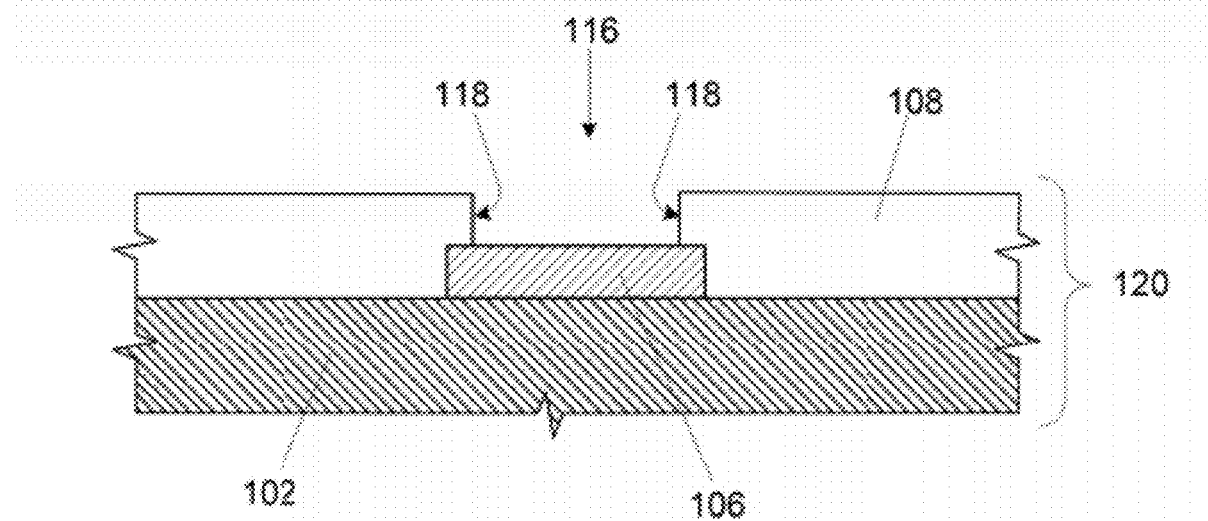
FIG. 2 illustrates a side cross-sectional view of an opening formed in the dielectric layer of FIG. 1.

As shown in FIG. 2, at least one via 116, having at least one edge 118, may be formed in the dielectric layer 108. In one embodiment, the via 116 may be formed using lithographic process, wherein an opening is patterned with a photoresist mask on the dielectric layer 108 and the via 116 is etched through the photoresist mask opening. The lithographic process may be used primarily in forming vias 116 in solder resist dielectric material layers 108. Specific lithography process steps and materials used in the fabrication of the vias 116 will be understood to those skilled in the art.

In another embodiment, the via 116 may be formed by laser drilling or ion drilling. The drilling process may be used primarily in forming vias 116 in the dielectric layer 108 used in forming the support substrate 102. The drilling process steps and materials used in the fabrication of the vias 116 will be understood to those skilled in the art.

Figure 3:
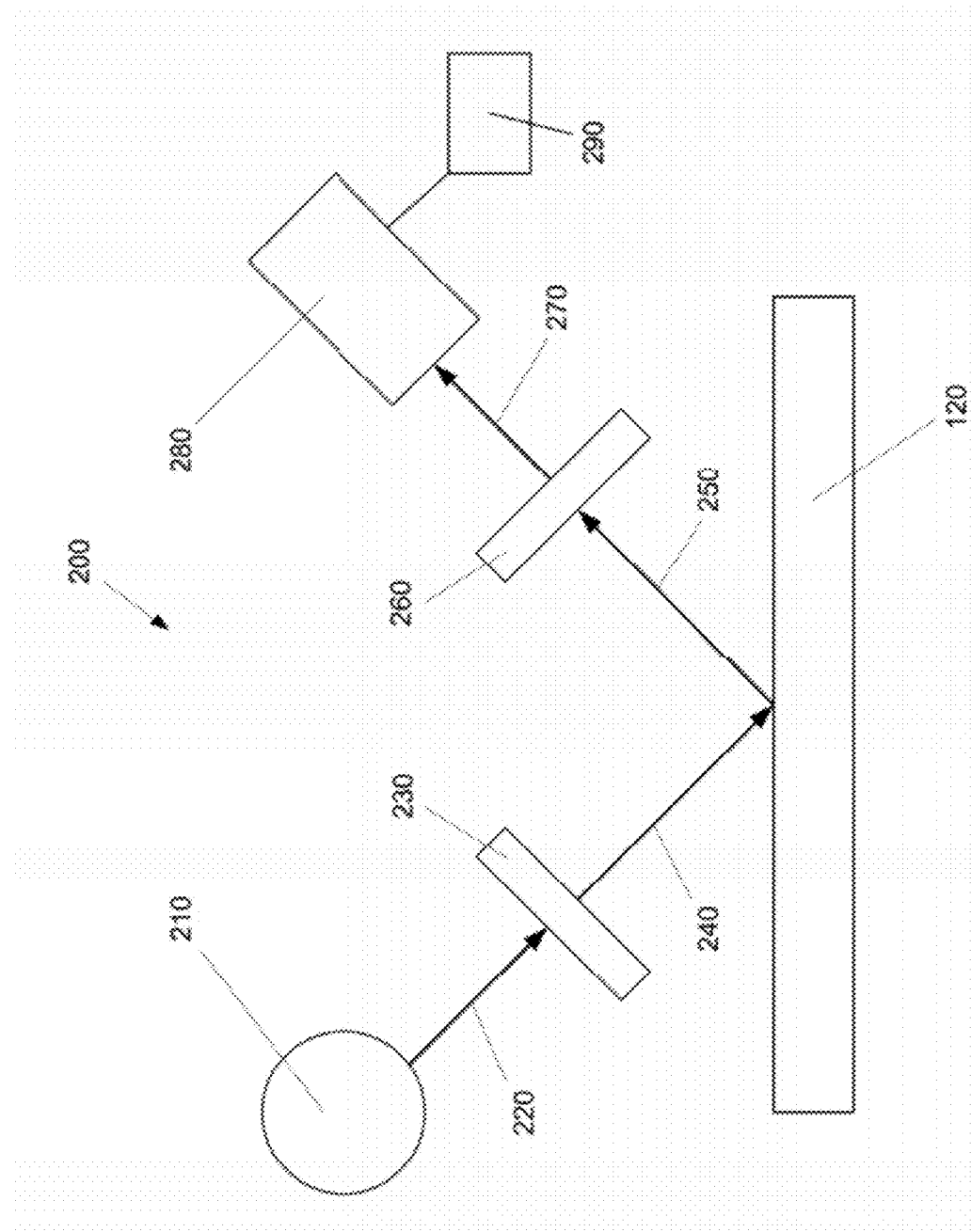
FIG. 3 illustrates a schematic of an alignment inspection system.

FIG. 3 illustrates a schematic of an alignment inspection system 200 comprising a light source 210, which generates a first light beam 220. The first light beam 220 may be passed through a first light filter 230 which filters the first light beam 220 for desired wavelengths and generates a first filtered light beam 240. The first filtered light beam 240 may be directed to the substrate 120 whereon the first filtered light beam 240 generates a fluoresced light 250 from the dielectric layer 108. The alignment inspection system 200 may further include a second light filter 260, which may filter the fluoresced light 250 for desired wavelengths to form a second filtered light beam 270. The second filtered light beam 270 may be directed into a light receiving device 280, such as a camera, which is connected to an image processing device 290.

The light source 210 may be any appropriate device, including a full-spectrum light (e.g. white light) generation device. In one embodiment, the light source 210 may be a Leica EL6000 light source, available from Leica Microsystems Inc., 2345 Waukegan Road, Bannockburn, Ill., United States of America.

The light receiving device 280 may be any appropriate light receiving device, such as a charge-coupled device (CCD) camera. In one embodiment, the light receiving device 280 may be a Hamamatsu ORCA AG Digital CCD Camera available, from Hamamatsu Photonics, 5000 Hiraguchi, Hamakita-ku, Mamamastu City, Shizuoka Pref., Japan.

In one embodiment, referring again to FIG. 3, the light source 210 may generate the full spectrum first light beam 220. The full spectrum first light beam 220 may be passed through the first light filter 230, which results in the first filtered light beam 240 having light wavelengths between about 400 nm and 480 nm (e.g. ultraviolet to blue light). The first filtered light beam 240 may be directed to the substrate 120 whereon the first filtered light beam 240 generates the fluoresced light 250 from the dielectric layer 108. However, the metal structures, such as the contact lands 106 of FIGS. 1 and 2, do not generate fluoresced light. The fluoresced light 250, as well as any incidental reflected light, may be filtered in the second light filter 260 to remove an incidental reflected light, such that the second filtered light beam 270 has light wavelengths greater than about 480 nm, and in one embodiment, between about 480 nm and 700 nm (e.g. green to red (visible)). The second filtered light beam 270 is then received by the light receiving device 280. It is understood that the second filtered light beam 270 essentially transmits an image of the surface of substrate 102 to the light receiving device 280, such as the image 300 shown in FIG. 4a.

Figure 4A:
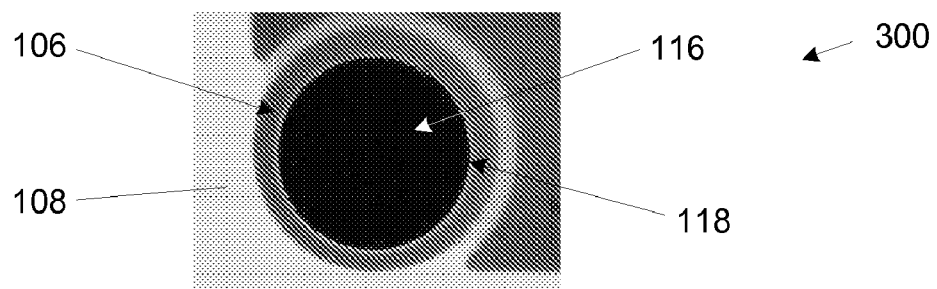
FIGS. 4a-4c illustrates top plan views of a process of alignment inspection.

FIG. 4a illustrates the contact land 106 with the via 116 exposing a portion of the contact land 106. As it can be seen from FIG. 4a, the non-fluorescing contact land 106 is a very dark color where it is exposed by the via 116 and a dark color where the dielectric layer 108 covers a portion thereof. Areas of the dielectric layer 108 were there are no underlying non-fluorescing elements are a light color.

The image 300 of FIG. 4a may be transferred to the image processing device 290 (see FIG. 3). The image processing device 290 may be a computing device executing image processing software, such as Image Pro® available from Media Cybernetics, Inc. 4340 East-West Hwy., Suite 400, Bethesda, Md. 20814-4411, United States of America.

In one embodiment, the image processing software may segregate the image 300 into three portions by using a green color gray scale. Using a gray scale for between 0 and 255, the exposed portion of the contact land 106 may have a near zero gray scale, the portion of the dielectric layer 108 covering the contact land 106 may have a gray scale between about 70 and 150, and the portion(s) of the dielectric layer 108 not covering a non-fluorescing element may have a gray scale of over 200. Using the gray scale color differentials, the image processing software can determine that diameters and origins of the via 116 and the contact land 106. The distance between the two origins is calculated as the alignment. Based on the specifications for the substrate 120, the image processing software can determine whether or not the alignment of the via 116 relative to the contact land 106 is within a prescribed specification tolerance. This determination can be used for quality assurance, wherein the substrate 120 may be accepted or rejected based on the position of the via 116 relative to the contact land 106. Furthermore, the determination may be fed back to the processing equipment forming the vias 116 for live adjustment of the processing equipment to correct any determined misalignment.

For the image 300 of FIG. 4a, the contact land 106 origin (i.e. center), i.e. in x/y coordinates, was found to be (529, 374) and via 116 origin was found to be (524, 388.5) which yield a delta (i.e. alignment) of (5, −14.15).

Figure 4B:
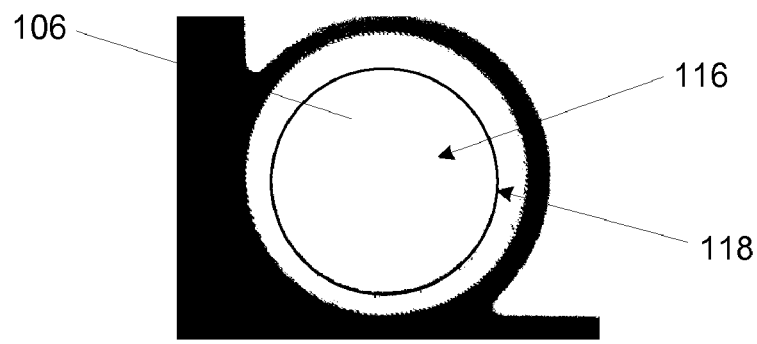
Figure 4C:
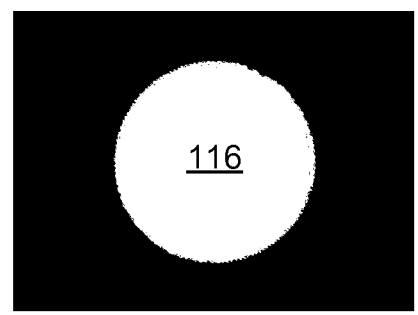

It is understood that the precision of the alignment measurements may be dependent on the optical resolution of the light receiving device 280, as well as the imaging process software precision for via edge 118 detection for calculating the center of the via 116. For an exemplary camera with 4M (four megapixels) and 10× optical lens (with ×10 eyepiece), the precision is expected to be within +/−1 um, since all of the measurements deal with images within one field of view. It is understood that the field of view can vary depending on the inspection equipment and required resolution. In example shown in FIGS. 4a-4c, the field of view was 2 mm by 2 mm.

In one embodiment, taking an image 300 (see FIG. 4a) with the light receiving device 280 (see FIG. 3) takes about 300 ms and processing with the image processing device 290 (see FIG. 3) takes about 100 ms. Thus, one measurement over one field of view can be done within about 1 second. Therefore, the process and equipment of the present description may determine alignment accuracy with sufficient speed that 100% screening can be achieved for quality control. Furthermore, the alignment determination speed may be sufficient to provide feedback to the via 116 forming process equipment, e.g. lithography and drilling (laser and ion) equipment, for real-time process adjustment to increase alignment accuracy.

Figure 5:
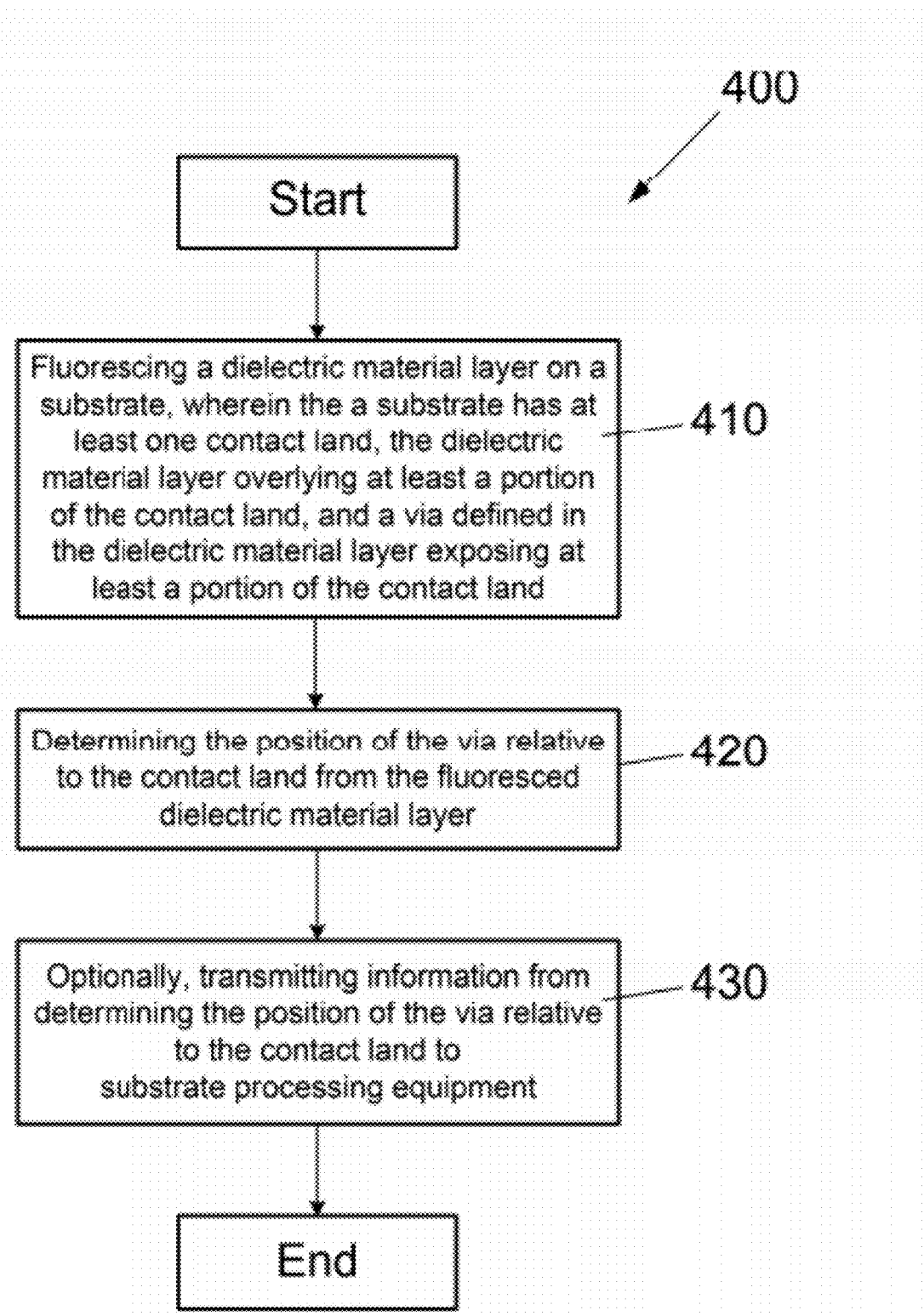
FIG. 5 is a flow chart of a process of inspecting the alignment of an opening in a substrate.

An embodiment of a process of inspecting the alignment of an opening in a substrate is illustrated in the flow diagram 400 of FIG. 5. As defined in block 410, a dielectric material layer on a substrate may be fluoresced, wherein the substrate has at least one contact land, the dielectric material layer overlying at least a portion of the contact land, and a via defined in the dielectric material layer exposing at least a portion of the contact land. The positions of the via relative to the contact land may be determined from the fluoresced dielectric material layer, as shown in block 420. As shown in block 430, the position determination of the via relative to the contact land may be transmitted to substrate processing equipment. The substrate processing equipment may be adjusted to alter the position of via formation in subsequently formed substrates based on the transmitted position determinations.

It is also understood that the subject matter of the present description is not necessarily limited to specific applications illustrated in FIGS. 1-5. The subject matter may be applied to other microelectronic device fabrication applications, including, but not limited to alignment inspection during the formation of trace routing layers (e.g. conductive via and trace formation on dielectric layers) during the fabrication of build-up layers on a microelectronic die or the formation of various component in a substrate. Furthermore, the subject matter may also be used in any appropriate application outside of the microelectronic device fabrication field, as will be understood to those skilled in the art.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A method of alignment detection comprising:
fluorescing a dielectric material layer on a substrate, wherein the substrate has at least one contact land, the dielectric material layer overlying at least a portion of the contact land, and at least one via defined in the dielectric material layer exposing at least a portion of the contact land; and
determining the position of the via relative to the contact land from the fluoresced dielectric material layer, comprising receiving light from the fluoresced dielectric material layer with a light receiving device, wherein the light receiving device is coupled to an image processing device for determining the position of the via relative to the contact land, and segregating the received light from the fluoresced dielectric material layer using a green color gray scale and using differentials in the green color gray scale to determine the origins of the via and the contact land.

2. The method of claim 1, further including accepting or rejecting the substrate based on the position of the via relative to the contact land.

3. The method of claim 1, further including transmitting information from determining the position of the via relative to the contact land to substrate processing equipment.

4. The method of claim 3, further including adjusting the substrate processing equipment to alter the position of via formation in subsequently formed substrates.

5. The method of claim 1, wherein the fluorescing the dielectric material layer comprises directing a first light beam having light wavelengths between about 400 nm and 480 nm to the dielectric material layer.

6. The method of claim 1, further including determining alignment as the distance between the via origin and the contact land origin.

7. The method of claim 1, wherein receiving light from the fluoresced dielectric material layer comprising receiving light having wavelengths greater than about 480 nm.

8. The method of claim 1, wherein receiving light from the fluoresced dielectric material layer comprising receiving light having wavelengths between about 480 nm and 700 nm.

9. The method of claim 1, wherein the substrate comprises:
providing a support substrate;
forming at least one contact land on the support substrate;
depositing a dielectric material layer on the support substrate and the at least one contact; and
forming a via through the dielectric material to expose at least a portion of the at least one contact land.

10. The method of claim 9, wherein forming the via through the dielectric material comprises forming the via with a lithographic process.

11. The method of claim 9, wherein forming the via through the dielectric material comprises laser drilling the via.

12. The method of claim 9, wherein forming the via through the dielectric material comprises ion drilling the via.

13. A method of alignment detection comprising:
fluorescing a dielectric material layer on a substrate by directing a first light beam having light wavelengths between about 400 nm and 480 nm to the dielectric material layer, wherein the substrate has at least one contact land, the dielectric material layer overlying at least a portion of the contact land, and at least one via defined in the dielectric material layer exposing at least a portion of the contact land;
receiving light having wavelengths greater than about 480 nm from the fluoresced dielectric material layer with a light receiving device, wherein the light receiving device is coupled to an image processing device;
transmitting light information from the light receiving device to the image process device, which uses a green color gray scale and differentials in the green color gray scale to determine the origins of the via and the contact land; and
accepting or rejecting the substrate based on the position of the via origin relative to the contact land origin.

14. The method of claim 13, further including adjusting substrate processing equipment to alter the position of via formation in subsequently formed substrates.

\* \* \* \* \*